United States Patent
Yang et al.

(10) Patent No.: US 10,868,242 B2
(45) Date of Patent: Dec. 15, 2020

(54) SUB 60NM ETCHLESS MRAM DEVICES BY ION BEAM ETCHING FABRICATED T-SHAPED BOTTOM ELECTRODE

(71) Applicant: Taiwan Semiconductor Manufacturing Company, Ltd., Hsinchu (TW)

(72) Inventors: Yi Yang, Fremont, CA (US); Dongna Shen, San Jose, CA (US); Yu-Jen Wang, San Jose, CA (US)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 16/452,909

(22) Filed: Jun. 26, 2019

(65) Prior Publication Data

US 2019/0386211 A1 Dec. 19, 2019

Related U.S. Application Data

(62) Division of application No. 16/008,629, filed on Jun. 14, 2018, now Pat. No. 10,418,547.

(51) Int. Cl.
| | |
|---|---|
| *H01L 43/12* | (2006.01) |
| *H01L 43/08* | (2006.01) |
| *H01F 10/32* | (2006.01) |
| *H01F 41/34* | (2006.01) |
| *H01L 43/02* | (2006.01) |
| *H01L 27/22* | (2006.01) |

(52) U.S. Cl.
CPC ......... *H01L 43/12* (2013.01); *H01F 10/3254* (2013.01); *H01F 41/34* (2013.01); *H01L 43/02* (2013.01); *H01L 43/08* (2013.01); *H01L 27/222* (2013.01)

(58) Field of Classification Search
CPC ......... H01L 43/12; H01L 43/02; H01L 43/08; H01L 43/10; H01L 27/222; H01F 10/3254; H01F 41/34
USPC ......................................................... 257/421
See application file for complete search history.

(56) References Cited

U.S. PATENT DOCUMENTS

| | | | |
|---|---|---|---|
| 9,029,170 B2 | 5/2015 | Li | |
| 9,911,914 B1 | 3/2018 | Annunziata et al. | |
| 10,069,064 B1 * | 9/2018 | Haq | ........................ H01L 43/08 |

FOREIGN PATENT DOCUMENTS

CN 107342331 11/2017

* cited by examiner

*Primary Examiner* — Tu-Tu V Ho
(74) *Attorney, Agent, or Firm* — Haynes and Boone, LLP

(57) ABSTRACT

A first conductive layer is patterned and trimmed to form a sub 30 nm conductive via on a first bottom electrode. The conductive via is encapsulated with a first dielectric layer and planarized to expose a top surface of the conductive via. A second conductive layer is deposited over the first dielectric layer and the conductive via. The second conductive layer is patterned to form a sub 60 nm second conductive layer wherein the conductive via and second conductive layer together form a T-shaped second bottom electrode. MTJ stacks are deposited on the T-shaped second bottom electrode and on the first bottom electrode wherein the MTJ stacks are discontinuous. A second dielectric layer is deposited over the MTJ stacks and planarized to expose a top surface of the MTJ stack on the T-shaped second bottom electrode. A top electrode contacts the MTJ stack on the T-shaped second bottom electrode plug.

20 Claims, 3 Drawing Sheets and preferably ≥50 nm. A dielectric layer 16 such as SiO2, SiN,
SUB 60NM ETCHLESS MRAM DEVICES BY ION BEAM ETCHING FABRICATED T-SHAPED BOTTOM ELECTRODE

PRIORITY DATA

The present application is a divisional application of U.S. application Ser. No. 16/008,629, filed Jun. 14, 2018, which is incorporated herein by reference in its entirety.

TECHNICAL FIELD

This application relates to the general field of magnetic tunneling junctions (MTJ) and, more particularly, to etchless methods for forming sub 60 nm MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define those millions of MTJ cells in each MRAM device and make them non-interacting to each other, precise patterning steps including reactive ion etching (RIE) are usually involved. During RIE, high energy ions remove materials vertically in those areas not masked by photoresist, separating one MTJ cell from another. However, the high energy ions can also react with the non-removed materials, oxygen, moisture and other chemicals laterally, causing sidewall damage and lowering device performance. To solve this issue, pure physical etching techniques such as ion beam etching (IBE) have been applied to etch the MTJ stack to avoid the damaged MTJ sidewall. However, due to their non-volatile nature, IBE etched conductive materials in the MTJ and bottom electrode can be re-deposited into the tunnel barrier, resulting in shorted devices. A new device structure and associated process flow which can form MTJ patterns with desired sizes without plasma etch is desired.

Several patents teach methods of forming an MTJ without etching, including U.S. Pat. No. 9,029,170 (Li et al) and Patent CN107342331 (Wang et al), but these methods are different from the present disclosure.

SUMMARY

It is an object of the present disclosure to provide a method of forming MTJ structures without chemical damage or re-deposition of metal materials on the MTJ sidewalls.

Another object of the present disclosure is to provide a method of electrically isolatedly forming MTJ patterns on top of a T-shaped bottom electrode without using a plasma etch.

Another object of the present disclosure is to provide a T-shaped bottom electrode and electrically isolatedly forming MTJ patterns on top of the bottom electrode without etching.

In accordance with the objectives of the present disclosure, a method for fabricating a magnetic tunneling junction (MTJ) structure is achieved. A first conductive layer is deposited on a first bottom electrode. The first conductive layer is patterned and trimmed to form a sub 30 nm conductive via on the first bottom electrode. The conductive via is encapsulated with a first dielectric layer. The first dielectric layer is planarized to expose a top surface of the conductive via. A second conductive layer is deposited over the first dielectric layer and the conductive via. The second conductive layer is patterned to form a sub 60 nm second conductive layer wherein the conductive via and second conductive layer together form a T-shaped second bottom electrode. MTJ stacks are deposited on the T-shaped second bottom electrode and on the first bottom electrode wherein the MTJ stacks are discontinuous. A second dielectric layer is deposited over the MTJ stacks and planarized to expose a top surface of the MTJ stack on the T-shaped second bottom electrode. A top electrode layer is deposited on the second dielectric layer and contacting the top surface of the MTJ stack on the T-shaped second bottom electrode plug to complete the MTJ structure.

Also in accordance with the objects of the present disclosure, an improved magnetic tunneling junction (MTJ) is achieved. The MTJ structure comprises a sub-60 nm MTJ device on a T-shaped second bottom electrode, a first bottom electrode underlying the T-shaped second bottom electrode, and a top electrode overlying and contacting the MTJ device.

BRIEF DESCRIPTION OF THE DRAWINGS

In the accompanying drawings forming a material part of this description, there is shown.

DETAILED DESCRIPTION

In the present disclosure, it is demonstrated that by using a high angle ion beam etching, we can create a T shaped bottom electrode. Since the bottom portion is only sub 30 nm, much smaller than the top portion of sub 60 nm, the later MTJ deposition cannot form a continuous film along the electrode, but forms separate patterns on top. Using this etchless process, any chemical damage and/or conductive metal re-deposition on the MTJ sidewall are avoided, improving the MRAM device performance.

In a typical MTJ process, the MTJ stack is deposited onto a uniformly sized bottom electrode. Plasma etch is used to transfer the photolithography created photoresist pattern into the MTJ stack. A physical etch such as pure Ar RIE or IBE can avoid chemical damage, but the metal re-deposition in this type of etch can cause electrically shorted devices. However, in the process of the present disclosure, the MTJ stack is deposited onto a T-shaped electrode, so that the patterns are formed without using plasma etch, avoiding these issues.

Figure 1:
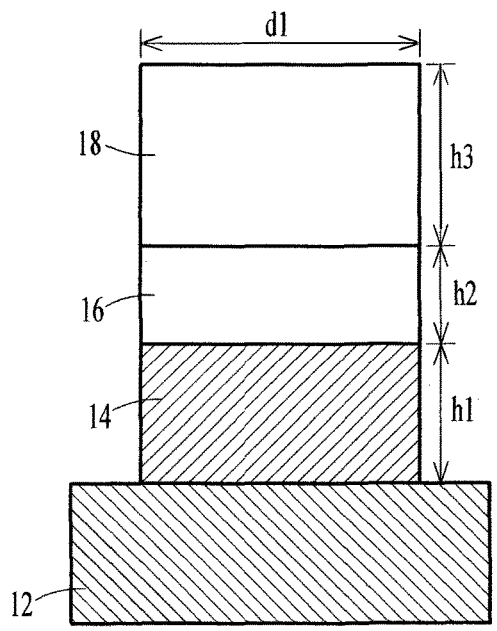
FIGS. 1 through 9 illustrate in cross-sectional representation steps in a preferred embodiment of the present disclosure.

The preferred embodiment of the present disclosure will be described in more detail with reference to FIGS. 1-9. FIG. 1 illustrates a first bottom electrode layer 12 formed on a semiconductor substrate, not shown. The first bottom electrode 12 is preferably Ta, TaN, Ti or TiN. On top of first bottom electrode or circuit 12, a conductive layer 14 such as Ta, TaN, Ti, TiN W, Cu, Mg, Ru, Cr, Co, Fe, Ni or their alloys is deposited to a thickness h1 of 10-100 nm, and preferably ≥50 nm. A dielectric layer 16 such as SiO2, SiN, SiON, SiC, or SiCN is deposited using chemical vapor deposition (CVD) or spin-coating to a thickness h2 of ≥90 nm.

Next, a photoresist is spin-coated and patterned by photolithography, such as 248 nm photolithography, forming photoresist patterns 18 with size d1 of approximately 70-80 nm and height h3 of ≥200 nm.

Figure 2:
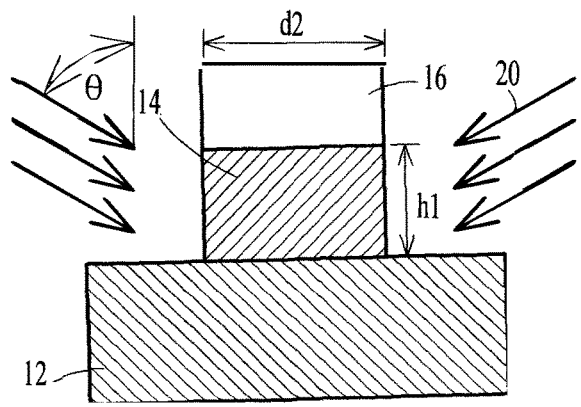

Now, the dielectric layer 16 and conductive layer 14 are etched by a fluorine carbon based plasma such as $CF_4$ or $CHF_3$ alone, or mixed with Ar and $N_2$. $O_2$ can be added to reduce the pillar size further. They can alternatively be patterned by a physical etch such as IBE. Metal layer 14 can also be patterned by a physical etch such as IBE or RIE using pure Ar plasma. Dependent on the thickness of the conductive layer 14, the dielectric layer 16 can be partially consumed. The conductive layer's remaining thickness is still h1 ($\geq$50 nm) with pattern size d2 of 15-70 nm, as shown in FIG. 2.

Figure 3:
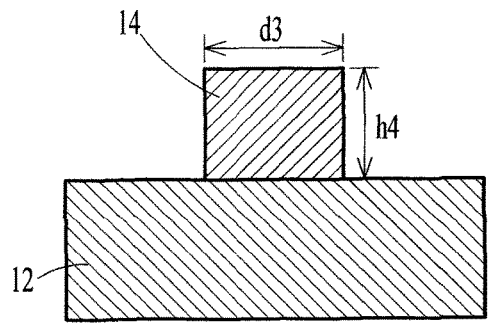

Next, a high angle IBE trimming 20 is applied to the conductive layer 14. The high angle ranges from 70-90° with respect to the surface's normal line. After IBE trimming, as shown in FIG. 3, the conductive layer pattern size decreases to d3, which can range from 10-30 nm, dependent on the IBE trimming conditions such as RF power (500-1000 W) and time (100-500 sec). Due to the protection of the remaining dielectric layer 16 on top of the conductive layer 14 (FIG. 2), and the extremely low vertical etch rate ($\leq$5 A/sec) of IBE at such a large angle, the remaining conductive layer height h4 is the same as h1, or decreases less than 5 nm after this step. Ex-situ IBE trimming is used when the conductive layer 14 is made of inert metals and in-situ IBE trimming is needed for metals that can be readily oxidized in air. Compared to the immersion 193 nm or EUV photolithography which is widely used to deliver similar results in the integrated circuit (IC) industry, this high angle IBE trimming is a much lower cost method. The remaining dielectric layer 16 and photoresist pattern 18 are consumed during the IBE trimming.

Figure 4:
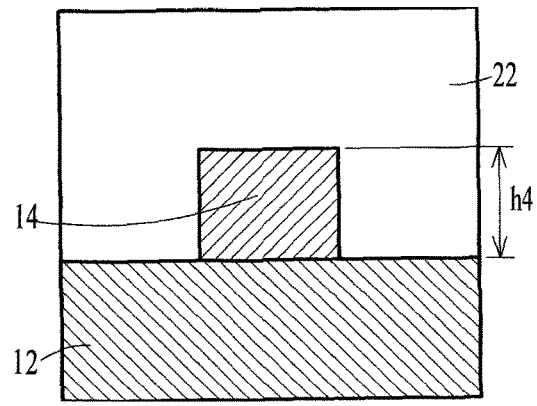

As illustrated in FIG. 4, a dielectric material 22 such as $SiO_2$, SiN, SiON, SiC, SiCN, or amorphous carbon is deposited to a thickness of $\geq$100 nm to encapsulate the conductive via 14. The dielectric material 22 may be deposited by physical vapor deposition (PVD), chemical vapor deposition (CVD), or atomic layer deposition (ALO). Whether ex-situ or in-situ PVD/CVD/ALD encapsulation is used is dependent on how sensitive these vias are to the atmosphere. Spin-on or amorphous carbon can also be used if the bottom electrode is made of an inert metal.

Figure 5:
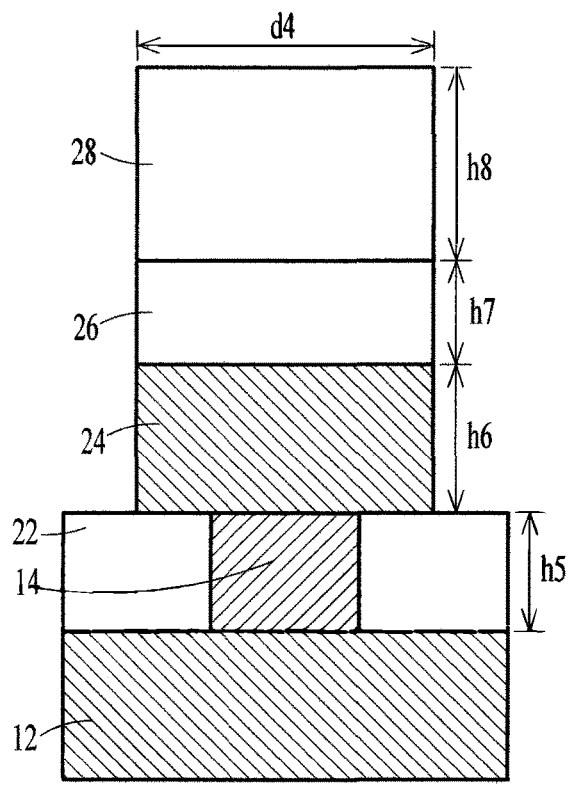

Chemical mechanical polishing (CMP) is applied to smooth the surface as well as expose the conductive vias 14 underneath, with remaining via height h5 of $\geq$45 nm, as shown in FIG. 5. Conductive via 14 forms the bottom pillar portion of the T-shaped bottom electrode. Now, the top portion of the T-shape will be formed.

A metal layer 24 such as Ta, TaN, Ti or TiN W, Cu, Mg, Ru, Cr, Co, Fe, Ni or their alloys is deposited with a thickness h6 of 10-100 nm and preferably $\geq$50 nm over the via 14 and planarized dielectric layer 22, as shown in FIG. 5. Dielectric layer 26 such as $SiO_2$, SiN, SiON, SiC, or SiCN with thickness h7 of $\geq$20 nm is deposited over metal layer 24. Photoresist with a thickness h8 of $\geq$200 nm is deposited and patterned by 248 nm photolithography to form photoresist mask 28. The dielectric 26 and metal layer 24 are etched by RIE, IBE or their combination to form the pattern size d4 of 50-60 nm, as shown in FIG. 6.

Figure 6:
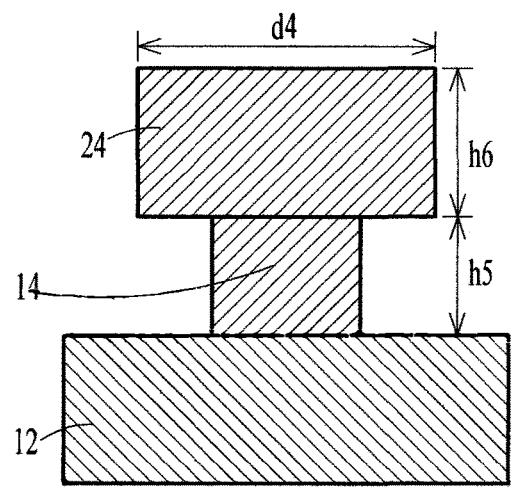

FIG. 6 illustrates the T-shaped bottom electrode 14/24 of the present disclosure. The dielectric encapsulation 22 and remaining hard mask 26 are stripped off to expose the entire T-shaped electrode. A fluorine carbon plasma with high carbon/fluorine ratio such as $C_4F_8$ or $CH_2F_2$ can be used to strip off materials like $SiO_2$, SiN, SiON, SiC, or SiCN, without etching the T-shaped bottom electrode. $O_2$ plasma can be used to strip off spin-on or CVD deposited carbon encapsulation. Ex-situ stripping is used when the metal vias are made of inert metals, but in-situ stripping is needed for metals that can be readily oxidized in air.

Figure 7:
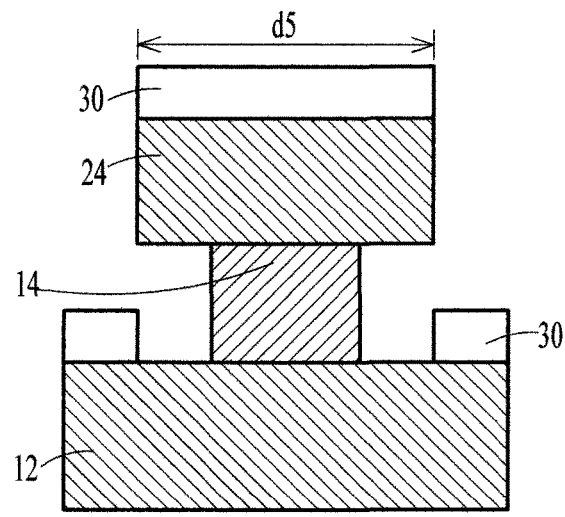

Now, as shown in FIG. 7, MTJ film layers are deposited, typically including a seed layer, a pinned layer, a barrier layer, a free layer, and a cap layer, for example. These layers form the MTJ film stack 30. The MTJ stack 30 can be deposited ex-situ, but preferably, the MTJ stack is deposited in-situ. After the MTJ stack is deposited, it only covers the top of the T-shaped bottom electrode 14/24 as well as the first bottom electrode 12 on the sides. It should be noted that the MTJ stack is discontinuous because of the undercut structure 24/14.

Figure 8:
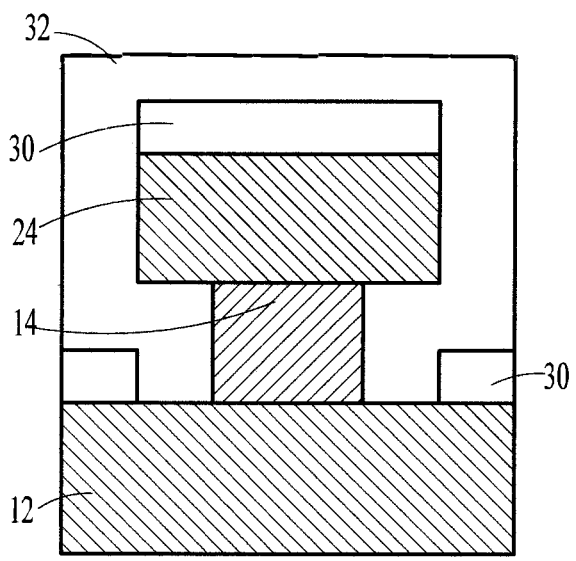

As a result, the MTJ patterns with size d5 (50-60 nm) are formed without plasma etch and thus, without plasma etch-induced chemical damage and/or conductive metal re-deposition on the MTJ sidewalls. Now, as shown in FIG. 8, dielectric layer 32 is deposited and flattened by CMP, for example, wherein the top MTJ surface is exposed. Finally, the top metal electrode 34 is deposited to form the whole device, also preferably in an in-situ method, as shown in FIG. 9.

In the process of the present disclosure, by decoupling the etch process, we can use a high angle ion beam etching to create a T-shaped bottom electrode to allow for etchless MTJ patterns. The top and pillar T-shaped electrode portions' sizes are sub 60 nm and 30 nm, respectively. After MTJ deposition, the same size of 60 nm MTJ patterns can be electrically isolatedly formed on top of the bottom electrode, without using an etching process. This approach avoids any chemical damage and/or conductive metal re-deposition on the MTJ sidewall, thus improving the MRAM device performance.

Figure 9:
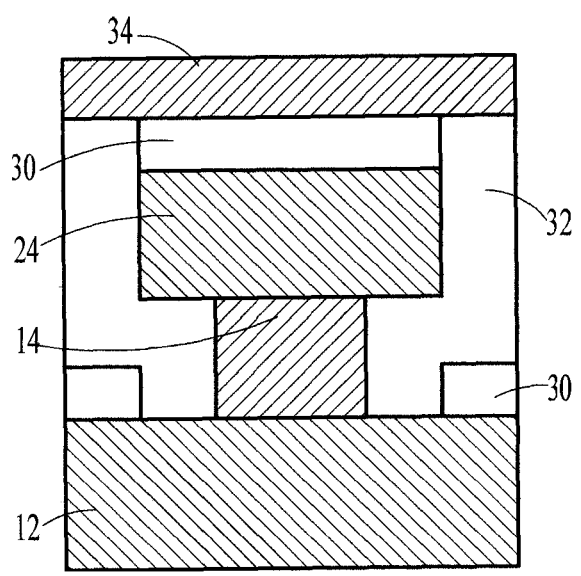

FIG. 9 illustrates the completed MTJ structure of the present disclosure. We used high angle IBE trimming to fabricate the T-shaped bottom electrode 14/24 to create MTJ patterns 30 without using a plasma etch. This approach avoids any chemical damage and/or conductive metal re-deposition on the MTJ sidewall, improving the MRAM device performance. Dielectric layer 32 covers the MTJ structures. Top electrode 34 contacted the MTJ structure 30.

The process of the present disclosure will be used for MRAM chips of size smaller than 60 nm as problems associated with chemically damaged sidewalls and re-deposition from the bottom electrode become very severe for these smaller sized MRAM chips.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A device, comprising:
    a first conductive feature disposed on a major surface of a bottom electrode layer, the first conductive feature extending away from the major surface of the bottom electrode layer in a first direction, the first conductive feature having a first dimension in a second direction, the second direction being generally perpendicular to the first direction;
    a second conductive feature disposed on the first conductive feature such that the first conductive feature is interposed between the bottom electrode layer and the second conductive feature, the second conductive feature having a second dimension in the second direction, the second dimension being greater than the first dimension;

an active magnetic tunneling junction (MTJ) structure disposed on the second conductive feature; and a first dummy MTJ structure disposed on the major surface of the bottom electrode layer, the first dummy MTJ structure being adjacent to a first sidewall of the first conductive feature in the second direction.

2. The device of claim 1, wherein the active MTJ structure has a third dimension in the second direction, the third dimension being substantially equal to the second dimension.

3. The device of claim 1, wherein the first dimension is from about 10 nanometers to about 30 nanometers.

4. The device of claim 1, wherein the second dimension is from about 50 nanometers to about 60 nanometers.

5. The device of claim 1, further comprising a dielectric layer encapsulating the first conductive feature, the second conductive feature, the active MTJ structure, and the first dummy MTJ structure.

6. The device of claim 1, further comprising a second dummy MTJ structure disposed on the major surface of the bottom electrode layer, the second dummy MTJ structure being adjacent to a second sidewall of the first conductive feature in the second direction.

7. The device of claim 1, wherein the first conductive feature includes a material selected from the group consisting of Ta, TaN, Ti, TiN, W, Cu, Mg, Ru, Cr, Co, Fe, Ni, and a combination thereof.

8. The device of claim 1, wherein the second conductive feature includes a material selected from the group consisting of Ta, TaN, Ti, TiN, W, Cu, Mg, Ru, Cr, Co, Fe, Ni, and a combination thereof.

9. A device, comprising:
a bottom electrode, including:
  a first conductive portion having a first height measured in a first direction perpendicular to a first surface of the first conductive portion, the first conductive portion having a first width measured in a second direction perpendicular to the first direction; and
  a second conductive portion disposed on the first surface of the first conductive portion, the second conductive portion having a second height measured in the first direction and a second width measured in the second direction, the second width being greater than the first width;
a first magnetic tunneling junction (MTJ) film stack disposed on a first surface of the second conductive portion;
a top electrode disposed on a first surface of the first MTJ film stack;
a second MTJ film stack adjacent to a first sidewall of the first conductive portion of the bottom electrode in the second direction; and
a third MTJ film stack adjacent to a second sidewall of the first conductive portion of the bottom electrode in the second direction, the second MTJ film stack and the third MTJ film stack being non-functional MTJ structures.

10. The device of claim 9, further comprising a dielectric material encapsulating the first conductive portion of the bottom electrode, the second conductive portion of the bottom electrode, the first MTJ film stack, the second MTJ film stack, and the third MTJ film stack.

11. The device of claim 10, wherein the top electrode extends over the dielectric material.

12. The device of claim 9, wherein the first height is greater than 45 nanometers.

13. The device of claim 9, wherein the first width is from about 10 nanometers to about 30 nanometers.

14. The device of claim 9, wherein the second height is from about 10 nanometers to about 100 nanometers.

15. The device of claim 9, wherein the second width is from about 50 nanometers to about 60 nanometers.

16. The device of claim 9, wherein a width of the first MTJ film stack, measured in the second direction, is substantially equal to the second width.

17. A device, comprising:
a bottom electrode disposed on a substrate, the bottom electrode including:
  a first portion disposed on the substrate, the first portion having a first lateral dimension; and
  a second portion disposed on the first portion, the second portion having a second lateral dimension greater than the first lateral dimension;
a functional magnetic tunneling junction (MTJ) film stack disposed on the second portion of the bottom electrode, the functional MTJ film stack having a third lateral dimension substantially equal to the second lateral dimension;
a first dummy MTJ film stack disposed on the substrate, the first dummy MTJ film stack being laterally spaced apart from a first sidewall of the first portion of the bottom electrode;
a second dummy MTJ film stack disposed on the substrate, the second dummy MTJ film stack being laterally spaced apart from a second sidewall of the first portion of the bottom electrode; and
a dielectric encapsulant surrounding the first portion of the bottom electrode, the second portion of the bottom electrode, the functional MTJ film stack, the first dummy MTJ film stack, and the second dummy MTJ film stack.

18. The device of claim 17, further comprising a top electrode disposed on the functional MTJ film stack.

19. The device of claim 17, wherein the first lateral dimension is from about 10 nanometers to about 30 nanometers.

20. The device of claim 17, wherein the second lateral dimension is from about 50 nanometers to about 60 nanometers.

* * * * *